(12) United States Patent
van de Beek et al.

(10) Patent No.: US 8,842,720 B2
(45) Date of Patent: Sep. 23, 2014

(54) PRE-EQUALIZER FOR A DIGITALLY MODULATED RF SIGNAL AND METHOD

(71) Applicant: NXP B.V., Eindhoven (NL)

(72) Inventors: Remco Cornelis Herman van de Beek, Eindhoven (NL); Massimo Ciacci, Den Bosch (NL); Jos Verlinden, Wachtendonk (DE); Ghaith Al-kadi, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/929,670

(22) Filed: Jun. 27, 2013

(65) Prior Publication Data

US 2014/0003484 A1    Jan. 2, 2014

(30) Foreign Application Priority Data

Jun. 28, 2012    (EP) .................................... 12174076

(51) Int. Cl.
| | |
|---|---|
| *H04L 25/03* | (2006.01) |
| *H03F 1/32* | (2006.01) |
| *H03F 3/195* | (2006.01) |
| *H04L 27/36* | (2006.01) |
| *H03F 3/24* | (2006.01) |
| *H04L 25/49* | (2006.01) |

(52) U.S. Cl.
CPC ........ H04L 25/03891 (2013.01); H03F 1/3241 (2013.01); H03F 3/195 (2013.01); H04L 25/49 (2013.01); H04L 25/03343 (2013.01); H04L 27/368 (2013.01); H03F 3/24 (2013.01)
USPC ....................................... 375/232

(58) Field of Classification Search
CPC ............ H04L 27/368; H04L 25/03343; H04L 25/03891; H03F 1/3241
USPC .......................................... 375/229, 230, 232
See application file for complete search history.

(56) References Cited

U.S. PATENT DOCUMENTS

| | | |
|---|---|---|
| 2005/0123066 A1 | 6/2005 | Sarca |
| 2010/0134255 A1 | 6/2010 | Witsching |
| 2011/0068868 A1 * | 3/2011 | Shi et al. ........................ 330/149 |
| 2013/0064271 A1 * | 3/2013 | van de Beek et al. ......... 375/219 |

OTHER PUBLICATIONS

Tomlinson, M. "New Automatic Equaliser Employing Modulo Arithmetric", IEEE Electronics Letters, vol. 7, No. 5/6, pp. 138-139 (Mar. 1971).

(Continued)

*Primary Examiner* — Kevin M Burd

(57) ABSTRACT

The method comprises receiving an input stream of symbols (x(i)) representing a phase change and magnitude of an RF signal, the magnitudes of the symbols are constant, the phase changes of the symbols encode digital information, and adjust the input stream of symbols to reduce inter-symbol interference. The adjusting iteratively determines a next symbol of the equalized stream (x'(n)) after receiving a next symbol of the input stream (x(n)) by multiplying the next symbol of the input stream (x(n)) with a next adjusting real number (a(n)), multiplying a previous symbol of the input stream (x(n−1)) with a previous adjusting real number (a(n−1)), the previous symbol being received before the next symbol of the input stream, and the next symbol of the equalized stream is computed from the multiplied next symbol and the multiplied previous symbol of the input stream.

9 Claims, 12 Drawing Sheets

(56) References Cited

OTHER PUBLICATIONS

"Identification Cards—Contactless Integrated Circuit(s) Cards—Proximity Cards—Part 2: Radio Frequency Power and Signal Interface", British Standard Institution, 22 pgs, retrieved from the internet at: www.nhzjj.com/asp/admin/editor/newsfile/20103181752 17930. pdf (Jul. 2001).

"Complex Multiplication", Wolfram MathWorld, 2 pg, retrieved from the internet at: http://mathworld.wolfram.com/ComplexMultiplication.html (2011).

"MATLAB The Language of Technical Computing", MathWorks, 2 pgs, retrieved from the internet at: http://www.mathworks.com/productsimatlab/ (2011).

"Quadratic Equation", Wikipedia, 16 pgs, retrieved from the internet at: http://en.wikipedia.org/wiki/Quadratic_equation, (2011).

Extended European Search Report for Patent Appln. No. 12174076.5 (Sep. 27, 2012).

* cited by examiner $$310 \quad x'(n) = \frac{\alpha(n) \cdot x(n) - p \cdot \alpha(n-1) \cdot x(n-1)}{1-p}$$

320

$$\alpha(n) = \alpha(n-1)\,\text{Re}\big(p \cdot \bar{x}(n)x(n-1)\big) + \sqrt{\alpha^2(n-1)\,\text{Re}^2\big(p \cdot \bar{x}(n)x(n-1)\big) + |1-p|^2 - \alpha^2(n-1)|p|^2}$$

330

$$\alpha(n) \approx \frac{1}{2} \cdot \big(1 - \alpha^2(n-1)|p|^2 - |p-1|^2\big)\big(1 + \alpha^2(n-1)\text{Re}\big(p \cdot \bar{x}(n) \cdot x(n-1)\big)\big)$$

PRE-EQUALIZER FOR A DIGITALLY MODULATED RF SIGNAL AND METHOD

CROSS-REFERENCE TO RELATED APPLICATIONS

This application claims the priority under 35 U.S.C. §119 of European patent application no. 12174076.5, filed on Jun. 28, 2012, the contents of which are incorporated by reference herein.

FIELD OF THE INVENTION

The invention relates to a method for pre-equalizing a digitally modulated RF signal, the method comprising
receiving an input stream of symbols (x(i)) representing a phase change and magnitude of an RF signal, the magnitudes of the symbols in the input stream are constant, the phase changes of the symbols in the input stream encode digital information,
adjusting the input stream of symbols to reduce inter-symbol interference in transmission of an RF signal modulated according to the input stream, thus obtaining an equalized stream of symbols (x'(i)), each symbol of the equalized stream representing a phase change and magnitude of an RF signal,
the adjusting comprising iteratively determining a next symbol of the equalized stream (x'(n)) after receiving a next symbol of the input stream (x(n)) by
computing the next symbol of the equalized stream from the next symbol of the input stream and the previous symbol of the input stream.

BACKGROUND OF THE INVENTION

Digital data communication over a wireless channel is used in a variety of applications. One way to encode digital information in an RF signal is by manipulating the phase of the signal in dependence on the digital information which is to be transmitted. At the receiving end the phase changes are detected and the digital information is reconstructed. Transmitting data by encoding the information in phase changes is referred to as phase-shift keying (PSK). For example, it conveys data by modulating the phase of a reference signal (the carrier wave).

Phase-shift keying (PSK) is used in a variety of applications such as: communication to and from RFID tags, wireless LAN, including Wi-Fi, and Bluetooth. PSK may use a finite number of phases to represent digital data, also called symbols. Each phase may be assigned a unique pattern of binary digits.

At the transmitter side, a modulator maps digital information to a sequence of symbols which in turn is encoded in the phase changes of a signal which is to be transmitted using an antenna. At the receiver end, a demodulator determines the phase of the received signal and maps it back to the symbol it represents, thus recovering the original digital information. Typically, the demodulator is designed specifically for the symbol-set used by the modulator.

The phase may be defined with respect to a reference signal, or with respect to a previous phase. In the first case, the demodulator of the receiver compares the phase of the received signal to the reference signal. In the latter case, the demodulator determines the changes in the phase of the received signal rather than the phase relative to a reference wave; this approach is termed differential phase-shift keying (DPSK) since it depends on the difference between successive phases.

When communicating over a wireless channel, one of the sources of error on the received data is inter-symbol interference (ISI), meaning that received symbols are affected by surrounding (typically past) transmitted symbols, for example due to a bandwidth limited physical channel. One of the methods to reduce ISI is to pre-equalize the signal applied to the channel on the transmitter side such that after passing through the channel, the ISI is zero. The intended signal, i.e., the phase modulated signal encoding the digital information, is modified before it is broadcasted over the antenna, anticipating the distortions that are going to occur due to inter-symbol interference. In the ideal case, the signal is received exactly as intended since the distortion that occurred exactly cancelled the pre-equalization.

One approach to pre-equalization is to apply a linear filter with a transfer that is the inverse of the channel transfer, so that the combination of filter plus channel is ISI free. This technique is referred to as zero-forcing equalization. A known signal distortion pre-compensation process is given in US patent application 2010/0134255 A1, "RIFD device, RFID system and signal distortion pre-compensation process in RFID system", incorporated herein by reference. The known signal distortion pre-compensation process is applied to an RFID system. An RFID device comprises an interface for transmitting wireless carrier and data signals to a remote RFID transponder. Carrier and data signal pre-compensation means are arranged between the antenna and the data signal processing means of the RFID device. The carrier and data signal pre-compensation means are adapted to pre-compensate signal distortions of the carrier and data signals caused by quality factors of the device air interface and the transponder air interface of the RFID device and the RFID transponder, respectively.

SUMMARY OF THE INVENTION

Although zero-forcing equalization works well to reduce inter-symbol interference there is a drawback. The inventor has realized that a constant amplitude signal which is pre-equalized using zero-forcing equalization does not have constant amplitude anymore after the pre-equalization. A constant magnitude is also known as a constant envelope. This means that amplifiers must be used which take varying magnitudes into account.

It would be advantageous to have an improved method for pre-equalizing a digital modulated RF signal. The improved method comprises receiving an input stream of symbols representing a phase change and magnitude of an RF signal, the magnitudes of the symbols in the input stream are constant, the phase changes of the symbols in the input stream encode digital information and adjusting the input stream of symbols to reduce inter-symbol interference in transmission of an RF signal modulated according to the input stream, thus obtaining an equalized stream of symbols, each symbol of the equalized stream representing a phase change and magnitude of an RF signal. The adjusting comprises iteratively determining a next symbol of the equalized stream after receiving a next symbol of the input stream by multiplying said next symbol of the input stream with a next adjusting real number, multiplying a previous symbol of the input stream with a previous adjusting real number, said previous symbol being received directly before said next symbol of the input stream, and computing the next symbol of the equalized stream from the multiplied next symbol of the input stream and the multiplied previous symbol of the input stream.

In conventional zero-forcing pre-equalization an input stream of symbols is also adjusted to take into account the inter-symbol interference that would occur during transmission of an RF signal modulated according to the input stream. The inter-symbol interference is determined with respect to a prediction of the RF channel. If the RF channel is exactly as predicted, the inter-symbol interference would exactly cancel. In particular if the input stream has constant magnitude, the stream that would be received across the channel has also constant magnitude. The inventors had the insight that in a phase-shift keying (PSK) no information is encoded in the magnitude. Thus there is no need for the symbols to have constant magnitude after transmission. On the other hand at the side of the transmitter, it would be advantageous if the equalized symbols have constants magnitude, since this allows an power-efficient switching amplifier to be used. However, zero-forcing pre-equalization does not have the flexibility to influence the equalized symbols in any way. Accordingly, with zero-forcing pre-equalization one cannot arrange a constant magnitude equalized stream by sacrificing constant magnitude after transmission.

The reduction of inter-symbol interference in transmission of an RF signal modulated according to the input stream may be measured with respect to a model of the RF channel, e.g., a prediction. Typically, the model is expressed as a single complex number, referred to as the 'pole'.

The pre-equalization scheme according comprises multiplying the symbols of the input stream with adjusting real numbers. This gives a much more versatile equalizer which can take the above wishes into account. Typically the next adjusting real number is not equal to the previous adjusting real number. Typically the next adjusting real number is not precisely equal to one.

The input stream is obtained from some digital source, say a digital processor e.g. a CPU, which encodes a stream of digital information into the input stream, by selecting the symbols of the input stream from a set of constellation points of a phase-shift keying digital modulation scheme. The use of symbols, per se, is well known in digital modulation of RF signals. Usually, a symbol is comprises a combination of an in-phase (I) and quadrature (Q) component. The in-phase and quadrature components are often represented as a complex number. In an implementation the in-phase and quadrature component may be represented digitally, or analog. Alternatively, a symbol may be represented by a combination of magnitude and phase. Magnitude/phase representation can be converted into in-phase (I)/quadrature (Q) representation, or vice versa, as desired. The symbols in the input stream and adjusted input stream may be represented as digital symbols. Computing the adjusted input stream may be implemented as software running on a computer processor.

In an embodiment, an adjusting stream of adjusting real numbers is generated iteratively. Each symbol in the input stream is multiplied with a corresponding number in the adjusting stream. Generating the adjusting stream comprises, after receiving the next symbol of the input stream determining the next adjusting real number of the adjusting stream, the next adjusting real number of the adjusting stream depending on said next symbol of the input stream, said previous symbol of the input stream and the previous adjusting real number in the adjusting stream of adjusting real numbers. The dependence may be expressed as a formula.

In an embodiment, the next symbol of the equalized stream is computed by multiplying said multiplied previous symbol with a predictive complex number (p) indicating the predicted RF channel and adding to the result said multiplied next symbol. Representing an RF channel with a predictive complex number (p), per se, is known in the art. This model is sometimes referred to as the single-pole channel.

In an embodiment, the adjusting stream depends only on the next symbol of the input stream, the previous symbol of the input stream, the previous adjusting real number in the adjusting stream and the predictive complex number.

It would be most advantageous if the magnitudes of the symbols in the equalized stream of symbols are, for practical purposes, equal. If the magnitudes are not exactly equal using a switching amplifier may add a small amount of distortion, but as long as these distortions are within the tolerances for the receiver of the transmitted stream, this is not a problem. This allows the use of approximations of the adjusting stream. For example, in an embodiment, the magnitude of the symbols in the equalized stream of symbols (x'(i)) are within a target magnitude multiplied with an upper-margin and target magnitude multiplied with a lower-margin, wherein the upper-margin is 1.1 and the lower-margin is 0.9.

The pre-equalization may be used in wireless communication applications using pure phase-shift keying (PSK) or 4-QAM. An example of such an application is very-high bit rate RFID communication according to the VHBR ISO14443 amendment, PSK version.

An aspect of the invention concerns a method for transmitting a digital modulated signal comprising the method of pre-equalizing a digital modulated signal as in any one of the preceding claims and further comprising, upconverting the equalized stream of symbols into an RF signal, and, in particular, amplifying the RF signal using a switching power amplifier. A switching power amplifier (also known as a Class D amplifier) is an electronic amplifier where all power devices (usually MOSFETs) are operated as binary switches. Switching power amplifier are particularly power efficient, however when used on a signal with non-constant amplitude they are known to easily distort the signal. By using an equalized stream with an (approximately) constant magnitude these amplifiers reduce power loss significantly, without losing fidelity.

An aspect of the invention is a pre-equalizer for use in a digital modulation RF transmitter. The pre-equalizer comprises an input interface for receiving an input stream of symbols (x(i)) representing a phase change and magnitude of an RF signal, the magnitudes of the symbols in the input stream are constant, the phase changes of the symbols in the input stream encode digital information, and an output interface for outputting an equalized stream of symbols (x'(i)) obtained by adjusting the input stream of symbols to reduce inter-symbol interference in transmission of an RF signal modulated according to the input stream, each symbol of the equalized stream representing a phase change and magnitude of an RF signal. The pre-equalizer is configured to iteratively determine a next symbol of the equalized stream (x'(n)) after receiving a next symbol of the input stream (x(n)), the pre-equalizer comprises a first multiplier configured to multiply said next symbol of the input stream (x(n)) with a next adjusting real number (a(n)), a second multiplier configured to multiply a previous symbol of the input stream (x(n−1)) with a previous adjusting real number (a(n−1)), said previous symbol being received directly before said next symbol of the input stream, and a symbol combiner configure to compute the next symbol of the equalized stream from the multiplied next symbol of the input stream and the multiplied previous symbol of the input stream.

An embodiment of the pre-equalizer comprises an adjustment stream source configured to iteratively generate an adjusting stream of adjusting real numbers, by after receiving the next symbol of the input stream determining the next adjusting real number of the adjusting stream, the next adjusting real number of the adjusting stream depending on said next symbol of the input stream, said previous symbol of the input stream and the previous adjusting real number in the adjusting stream of adjusting real numbers.

An aspect of the invention is a digital modulation RF transmitter comprising a pre-equalizer, an upconverter configured to upconvert the equalized stream of symbols into an RF signal, and, preferably, a switching power amplifier configured to amplifying the RF signal of the upconverter.

The pre-equalizer is preferably implemented as an electronic device, in particular a mobile electronic device, e.g., a mobile phone, RFID device, RFID transponder, Wi-Fi and/or Bluetooth device, etc.

A method according to the invention may be implemented on a computer as a computer implemented method, or in dedicated hardware, or in a combination of both. Executable code for a method according to the invention may be stored on a computer program product. Examples of computer program products include memory devices, optical storage devices, integrated circuits, servers, online software, etc. Preferably, the computer program product comprises non-transitory program code means stored on a computer readable medium for performing a method according to the invention when said program product is executed on a computer In a preferred embodiment, the computer program comprises computer program code means adapted to perform all the steps of a method according to the invention when the computer program is run on a computer. Preferably, the computer program is embodied on a computer readable medium.

A method and circuitry for active transmitter-side pre-equalization in phase-shift keying (PSK) communication systems is proposed, removing inter-symbol interference from the channel output and allowing a power-efficient constant-envelope power amplifier to be used in the transmitter. The method uses a pre-equalizer that calculates the necessary phase of the channel input signal (given its constant amplitude) in order to cancel inter-symbol interference for optimum signal reception on receiver side. An added benefit is that the power contained in the received signal is significantly higher than when using conventional zero-forcing pre-equalization.

BRIEF DESCRIPTION OF THE DRAWINGS

These and other aspects of the invention are apparent from and will be elucidated with reference to the embodiments described hereinafter. In the drawings, FIG. 1 constellation diagram illustrating zero-forcing pre-equalization, FIG. 2 constellation diagram illustrating phase-only pre-equalization, FIG. 3 schematic block diagram illustrating an implementation of a phase-only pre-equalizer.

Figure 1:
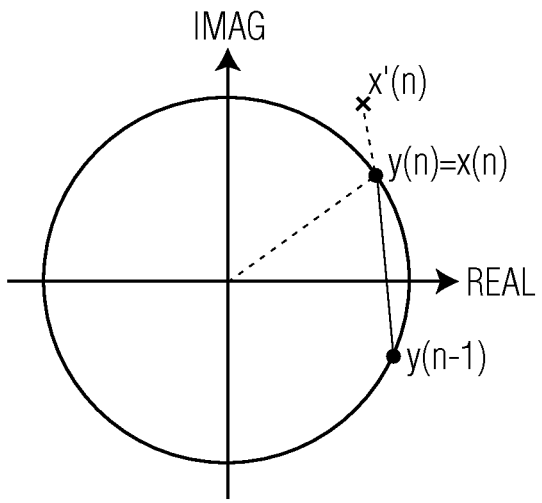

It should be noted that items which have the same reference numbers in different Figures, have the same structural features and the same functions, or are the same signals. Where the function and/or structure of such an item has been explained, there is no necessity for repeated explanation thereof in the detailed description.

LIST OF REFERENCE NUMERALS (FIG. 10-11D)

110 an input stream
120 an equalized stream
130 an adjustment stream
140 a channel output stream
200 a pre-equalizer
205 a input stream symbol source
207 an up-converter
208 a switching power amplifier
209 an antenna
210 an input interface
220 a delay element
232 a first real multiplier
234 a second real multiplier
230 an adjustment stream source
240 a symbol combiner
250 an output interface

DETAILED EMBODIMENTS

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described.

Figures 10, 11A:
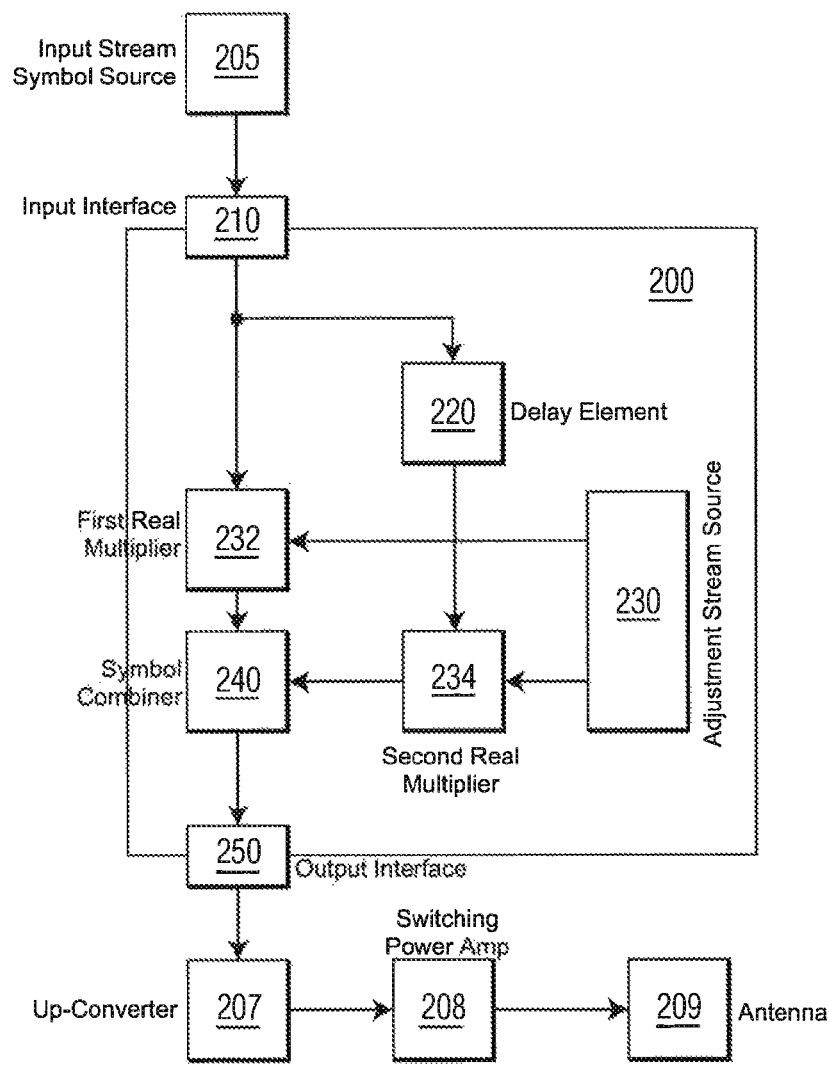
FIG. 10 shows formulas illustrating streams.
FIG. 11a, 11b, 11c, 11d illustrate embodiments of a pre-equalizer.

We use the notation illustrated by FIG. 10. In FIG. 10, Stream 110 denotes an input stream. The input stream represents an input stream of symbols which encode a stream of digital information; the two final symbols are: x(n) is the next symbol, and x(n−1) the previous symbol. Stream 120 denotes an equalized stream of output symbols: these are ready for upconverting and amplifying. Stream 130 denotes an adjusting stream. Stream 140 denotes the channel output, i.e., the symbols that are actually received by a receiver for receiving a digitally modulated RF signal, after transmission.

FIG. 1 illustrates zero-forcing pre-equalization in the complex plane.

FIG. 1 is a so-called constellation diagram. Often constellation points are represented in a constellation diagram. The constellation diagram displays an RF signal as a two-dimensional scatter diagram in the complex plane at symbol sampling instants. It represents the possible symbols that may be selected by the modulation scheme as points in the complex plane. Constellation diagrams may also be measured to visualize the interference and distortion in a signal.

When communicating over a wireless channel, one of the sources of error on the received data is inter-symbol interference (ISI), meaning that received symbols are affected by surrounding (typically past) transmitted symbols, for example due to a bandwidth limited physical channel. One of the methods to reduce ISI is to pre-equalize the signal applied to the channel on the transmitter side such that after passing through the channel, the ISI is zero.

The previous channel output is shown in the figure by point y(n−1). In zero-forcing it is assumed by the equalizer to be equal to x(n−1). Then the pre-equalizer applies input x'(n) to the channel. The solid line shows the time-continuous complex amplitude (also known as phasor) of the channel output which is a path in the complex plane. At the instant when the system samples this signal, the complex amplitude would exactly equal the wanted value of x(n).

Note that the next zero-forced equalized point x'(n), does not have the same magnitude as x(n−1).

The channel is described in a time-discrete baseband model by a single pole in p, the channel output y as a response to the channel input x' (which is delivered by the pre-equalizer) A conventional zero-forcing pre-equalizer in the discrete time domain can be described by: $y(n)=p\cdot y(n-1)+(1-p)\cdot x'(n)=x(n)$. The latter equality states the function of the ideal pre-equalizer: to make the channel output y equal to the wanted value x by applying pre-equalized value x' at the channel input. Note p is a complex number which represents a model, e.g. an approximation or prediction, of the RF channel. Solving for x'(n) gives:

$$x'(n) = \frac{x(n) - p \cdot y(n-1)}{1-p}.$$

So in order for the pre-equalizer to generate channel inputs x'(n) it needs to know the value of y(n−1), which is the channel past. However, assuming that the equalizer did a good job so far, we can assume that y(n−1)=x(n−1), so the equation for x'(n) now becomes:

$$x'(n) = \frac{x(n) - p \cdot x(n-1)}{1-p}.$$

Note that the next equalized symbol depends on the previous two input symbols, as is. No real multiplication of any kind is involved.

Figure 2:
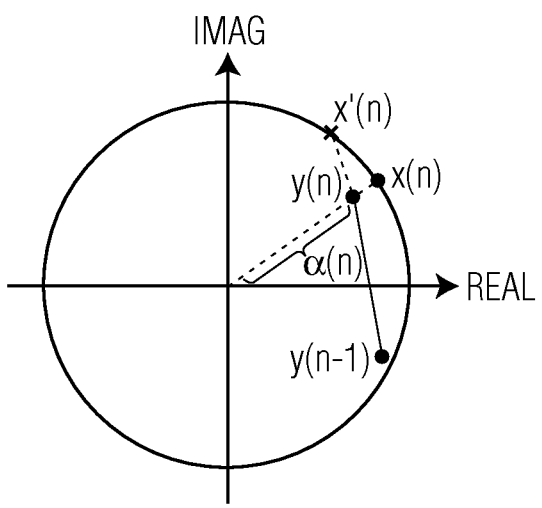

FIG. 2 shows the concept of phase-only pre-equalization in the complex plane, At the sampling instant the phase of y(n) equals the wanted phase of x(n) by applying a constant-envelope x'(n) to the channel input. The magnitude of x'(n) and x(n) are both constant, but the magnitude of y(n) is not.

In case a system is used where phase shift keying (PSK) is employed to transmit information over the channel, the phase of the transmitted signal would contain the information whereas the amplitude of the transmitted signal would remain constant. This constant amplitude would allow for an energy-efficient power amplifier driving the channel (since constant-envelope power amplifiers are typically more power efficient than power amplifiers that have to create a signal with varying amplitude).

However, when having to drive a bandwidth-limited channel causing inter-symbol interference combined with using the zero-forcing pre-equalizing technique described before to remove said inter-symbol interference, the signal applied to the channel (x') would not be of constant envelope (in order to make the signal after the channel (y) of constant envelope and with a phase carrying the information without ISI being present).

This means that to apply the pre-equalized signal to the channel, a power amplifier that can generate signals of varying amplitude would be needed, which are typically less power efficient than constant-envelope power amplifiers. Additionally, generating such varying amplitude typically requires more hardware, for example a full polar-modulator with separate phase and amplitude signal paths in the transmitter.

The improved method makes use of the fact that the amplitude of the transmitted signal does not contain information when a pure PSK is used. The pre-equalizer described here removes inter-symbol interference from the phase of the signal at the receiver side while allowing the amplitude of the signal to vary. Allowing a variable received amplitude makes it possible to use an energy-efficient constant-envelope power amplifier at the transmitter side.

A non-linear pre-equalizer is proposed that calculates the phase of constant-envelope signal x' (the signal driving the channel) such that ISI in the phase of the channel output (the phase of y) is cancelled. Ideally it calculates a signals x'(n) under the boundary conditions:

1. Magnitude of x' is constant to allow for an energy-efficient constant-envelope power-amplifier driving the channel.
2. Phase of the resulting channel output y when applying x' at the channel input is equal to the phase of x (the information-carrying quantity in a PSK system) and therefore ISI-free.

However both condition may be relaxed.

A phase-only pre-equalizer does not force y(n) to equal x(n) as was done in zero-forcing, but rather only forces the phase of y(n) to equal the phase of x(n), since we assumed a PSK system where the amplitude of the channel output does not carry information and can therefore be ignored in the receiving side. In order to enable the use of a constant-envelope power amplifier, we may add another boundary condition on the solution, namely that the magnitude of x' should be constant. For ease of explanation, we will assume that this constant magnitude equals 1. Below we derive how a next symbol may be computed.

First, we can again write the function of the pre-equalizer in a discrete time equation: $y(n)=p\cdot y(n-1)+(1-p)\cdot x'(n)=\alpha(n)\cdot x(n)$, wherein $\alpha(n)$ is a (currently unknown) positive real number (as opposed to y, x and x' which are complex numbers with a certain magnitude and phase) representing the fact that the phase of y(n) equals that of x(n) but their magnitudes may differ.

We add the boundary condition: $|x'(n)|\equiv 1$ to indicate the constant-envelope signal driving the channel. One may prove that these equations can be solved as:

$$x'(n) = \frac{\alpha(n) \cdot x(n) - p \cdot \alpha(n-1) \cdot x(n-1)}{1-p}.$$

with the value of α(n) defined recursively as:

$$\alpha(n) = \alpha(n-1)\text{Re}(p \cdot \overline{x}(n)x(n-1)) + $$
$$\sqrt{\alpha^2(n-1)\text{Re}^2(p \cdot \overline{x}(n)x(n-1)) + |1-p|^2 - \alpha^2(n-1)|p|^2}$$

The above two formula's give recursive definitions for the equalized stream and for the adjusting stream. Using the above values for the adjusting stream 130 gives a phase-only adjusted pre-equalized stream. However, it is noted that by relaxing the conditions, e.g., by approximating the adjusting stream α(n) (sometimes denoted herein as a(n)), advantageous results may be achieved. The transmission system is described in the time-discrete baseband domain, meaning that the typical complete transceiver chain (digital-to-analog conversion, RF up-conversion, power amplifier, transmit antenna, channel, receive antenna, RF down-conversion, analog-to-digital conversion) is modeled only at the time-discrete sample instants.

Figure 3:
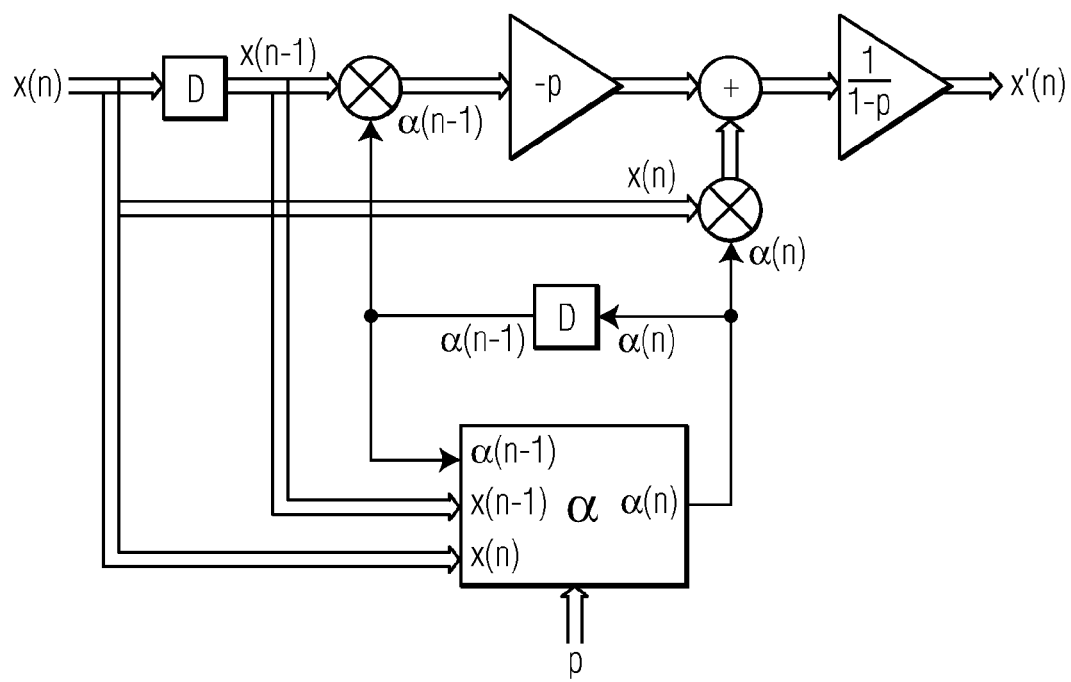

FIG. 3 illustrates a Phase-only pre-equalizer implementation. This figure shows an implementation of computing the equalized stream x'(n). The block marked α contains an implementation of the mathematical function describing the adjusting stream. This block may also contain a simplified function that approximates the equation defined above.

The double-line signals in FIG. 3 indicate complex signals. The multipliers in FIG. 3 are half-complex multipliers, which are implemented using two real multipliers. The adder is a full-complex adder, which is implemented using two real adders. Finally, the gain stages are complex gain stages, implemented using four real multipliers and two adders, or three multipliers and five adders.

The modulation technique following the pre-equalizer (signal x' typically modulates an RF carrier) or the power amplifier driving the antenna may be implemented using conventional means. For example, a typical polar-modulator may be used, however, without the need for an amplitude path since the amplitude of x' is constant by construction.

It should be noted that in many cases the last amplification block 1/(1−p) in FIG. 3 can be completely left out, since its function is mostly not necessary in a PSK system: the constant amplitude gain of 1/abs(1−p) it provides is usually not important, since we are dealing with a PSK system. The constant phase rotation of −arg(1−p) it provides is usually also not important since a constant phase rotation typically can be handled by the system (for example in differential PSK systems, where the information is in fact encoded in phase differences).

The block marked α in FIG. 3 may be expensive to realize if using the square-root function described above. Instead of implementing such an equalizer, however, it is also possible to approximate the solution. In that case the ISI would not completely be cancelled, but at least be reduced significantly. Below, one approach to such an approximated solution is given that simplifies implementation of the pre-equalizer.

One example of a simplified function α(n) is given below (the bar above x represents complex conjugation):

$$\alpha(n) \approx \frac{1}{2} \cdot (1 - \alpha^2(n-1)|p|^2 - |p-1|^2)(1 + \alpha^2(n-1)\text{Re}(p \cdot \overline{x}(n) \cdot x(n-1))).$$

This approximation involves only addition and (complex) multiplications. These approximations are given only to clarify that the rather complicated function given by above does not need to be implemented literally but may be approximated in some way to reduce hardware complexity.

The digital hardware required for phase-only pre-equalization is more complicated than that needed for the conventional zero-forcing approach. The power consumed in the extra digital hardware is outweighed by the power gained in the analog up-conversion/power amplification circuitry.

FIG. 4-9 illustrate simulated results. The behavior of the pre-equalizer has been verified and compared to situations where no pre-equalizer is used or where an ideal zero-forcing pre-equalizer is used. Also, the approximation techniques have been verified this way. Also, some non-ideal situations are illustrated, e.g., wherein the predicted channel pole p is slightly different from the actual channel pole, or cases where the phases that can be produced by the transmitter are quantized with a certain accuracy rather than having a continuous range of producible phases available at the modulator output.

For the simulations, an 8PSK modulation was used. The pole location p was chosen such that the channel −3 dB bandwidth was only 18% of the symbol frequency and such that the channel was mistuned by 3% of the symbol frequency. For example, in 13.56 MHz RFID, the channel in the RF domain is a bandpass filter that is ideally centered around the carrier. In this simulation it was mistuned by 3% of the symbol frequency. The input symbols x (symbols to be transmitted) were chosen randomly from the 8PSK alphabet with no correlation between symbols.

The RMS and peak values of the ISI-induced phase error are given normalized to a symbol interval (S.I.) which is the phase difference between two adjacent symbols in the PSK symbol alphabet. An error larger than 0.5 S.I. means that a slicing level has been crossed, corresponding to a symbol error. From the RMS and peak error numbers it follows that equalization is necessary to prevent symbol errors for the channel used in the simulations.

Figure 4A:
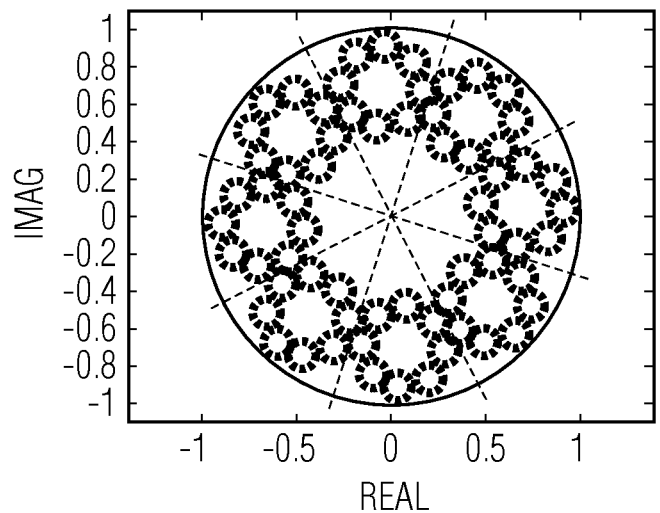
FIG. 4a shows the values of the channel output (y) when no pre-equalization is done.
Figure 4B:
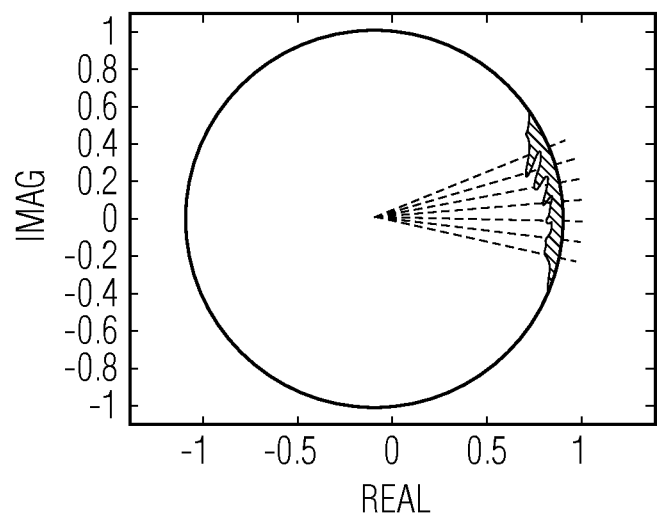
FIG. 4b shows the values of the channel output (y) when no pre-equalization is done.

FIGS. 4*a* and 4*b* show the values of the channel output (y) (plotted in the complex plane) when no pre-equalization is done altogether. Note that the left plot shows results for 8PSK using the full circle (2π-PSK), whereas the right-hand side corresponds to the part-circle PSK that was proposed to the ISO standardization body for use in very-high bit rate 13.56 MHz RFID systems. The grey rays originating from the figure origin indicate the so-called hard slicing-levels, which are the decision levels used to determine which symbol was transmitted.

FIG. 4*a* is using 2π-PSK, and has RMS phase error: 0.31 S.I. and Peak phase error: 0.73 S.I. FIG. 4*b* is using 56° PSK segment and has RMS phase error: 0.74 S.I, Peak phase error: 1.58 S.I.

Figure 5A:
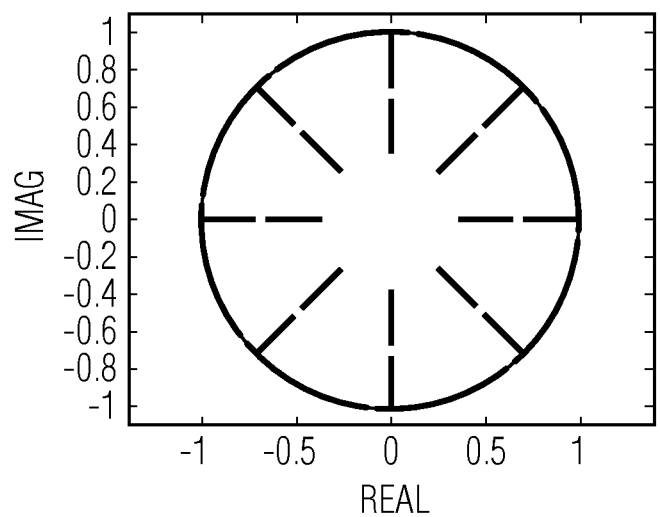
FIG. 5a shows the results when applying the phase-only pre-equalizer.
Figure 5B:
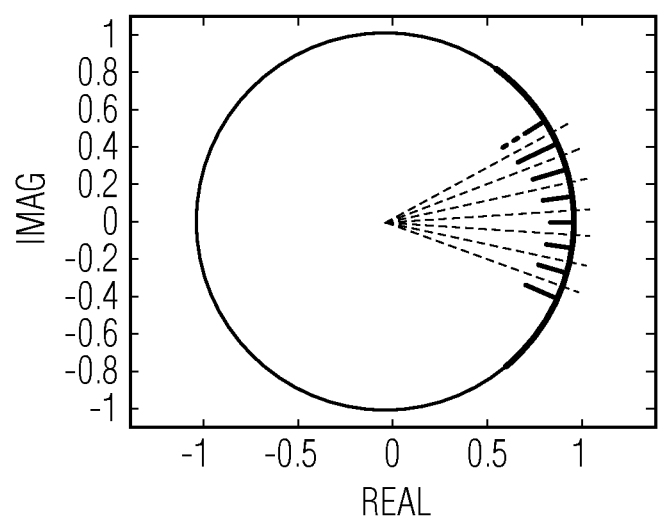
FIG. 5b shows the results when applying the phase-only pre-equalizer.

FIGS. 5*a* and 5*b* show the results when applying the phase-only pre-equalizer. It is clearly visible that the phases of y are completely ISI-free and that the amplitude (magnitude) of y indeed shows some variation (especially so in the case of 2π-PSK). The set of grey circles on the unit circle show the range of applied channel inputs (x') necessary to realize the ISI-free signal. FIG. 5*a* uses 2π-PSK. FIG. 5*b* uses 56° PSK segment.

Figure 6A:
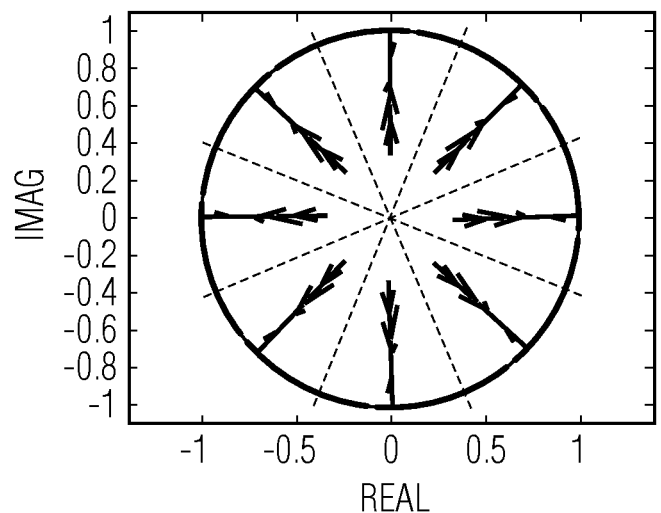
FIG. 6a shows the performance of the approximated phase-only pre-equalizer according to equation 330 of FIG. 12.
Figure 6B:
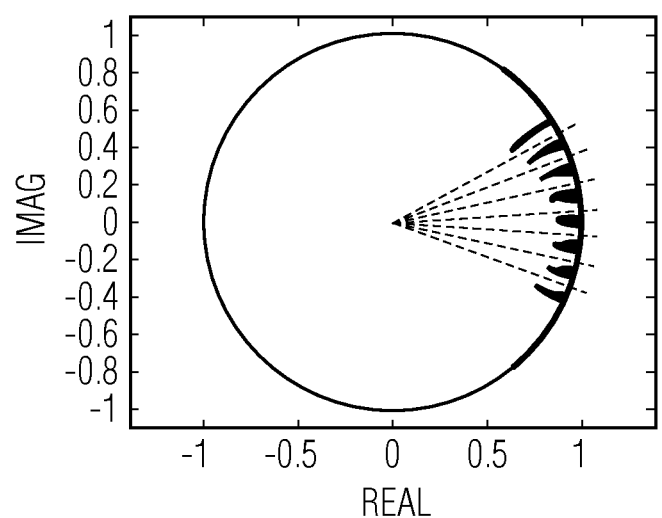
FIG. 6b shows the performance of the approximated phase-only pre-equalizer according to equation 330 of FIG. 12.
Figure 11B:
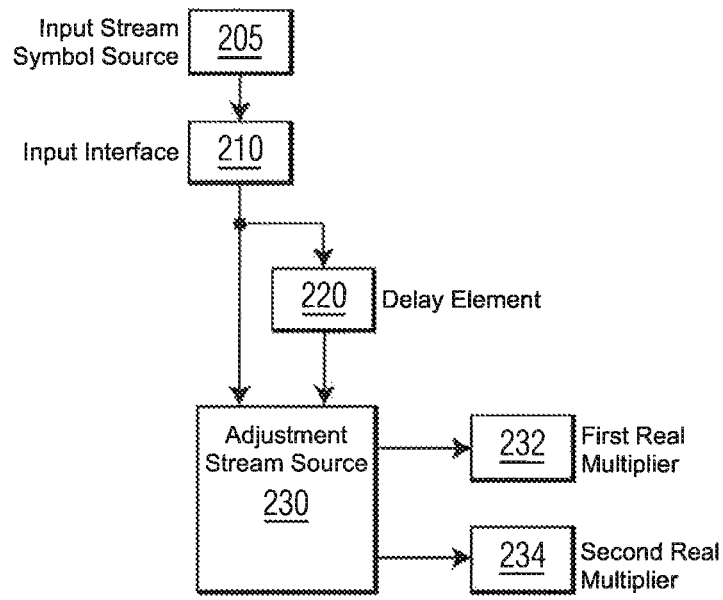
Figure 11C:
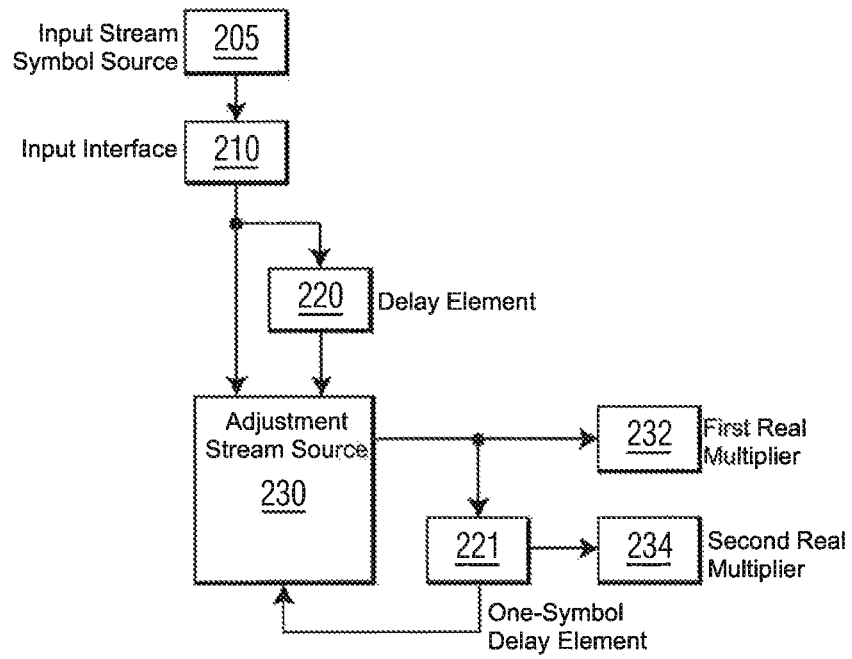
Figures 11D, 12:
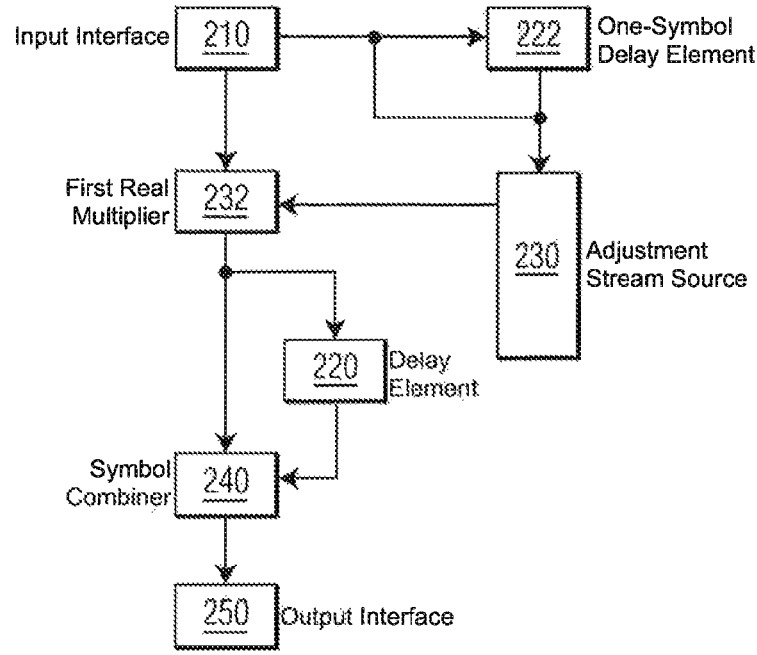
FIG. 12 shows formulas illustrating phase-only equalization.

FIGS. 6*a* and 6*b* show the performance of the approximated phase-only pre-equalizer according to equation 330 of FIG. 12. Even though performance is obviously not completely ISI-free, the amount of ISI compared to no equalization is still reduced with an order of magnitude in this channel. FIG. 6a uses 2π-PSK and has RMS phase error: 0.029 S.I and Peak phase error: 0.11 S.I. FIG. 6b uses 56° PSK segment and has RMS phase error: 0.072 S.I and Peak phase error: 0.20 S.I.

FIGS. 7a and 7b and FIGS. 8a and 8b show the results under the influence of non-ideal conditions (now using the perfect implementation of the α(n) function according to the unapproximated equation featuring the square-root operation).

Figure 7A:
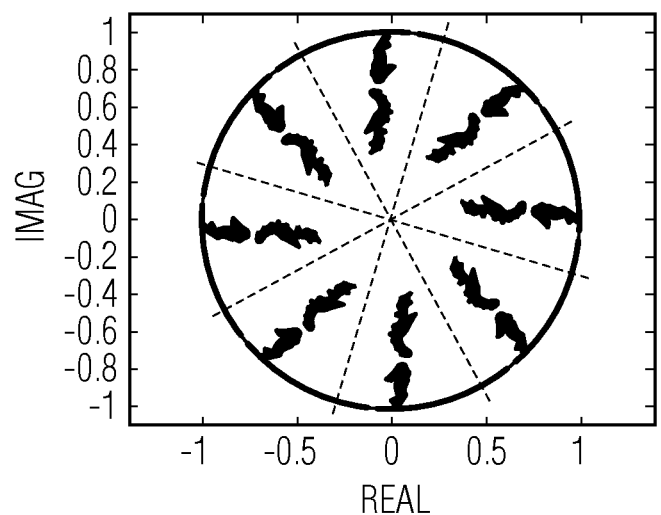
FIG. 7a shows the results under the influence of non-ideal conditions.
Figure 7B:
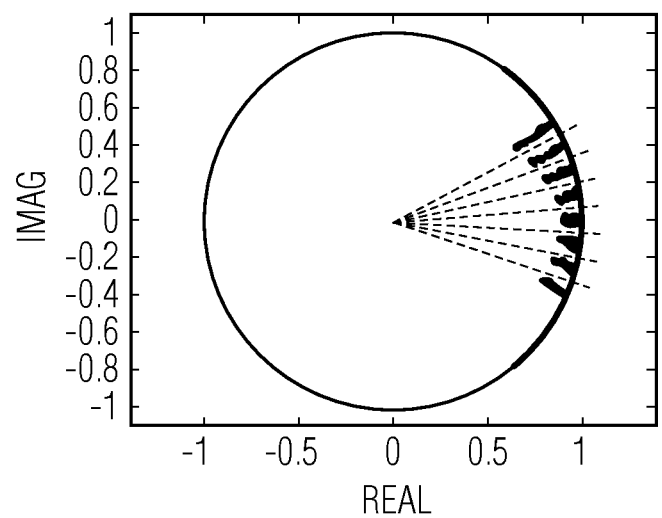
FIG. 7b shows the results under the influence of non-ideal conditions.
Figure 8A:
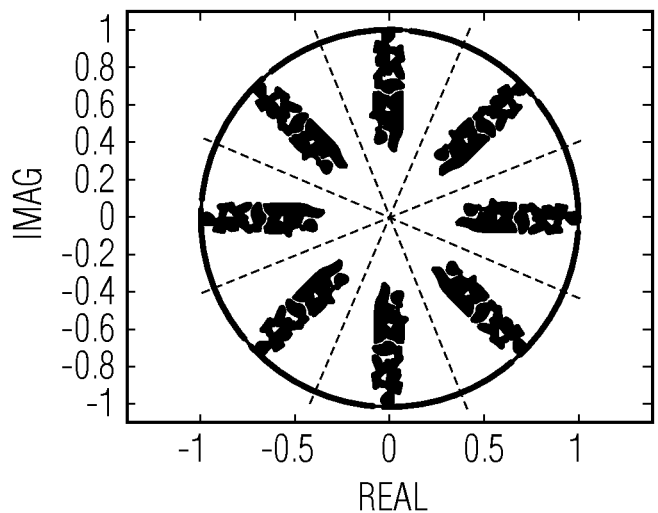
FIG. 8a shows the results under the influence of non-ideal conditions.
Figure 8B:
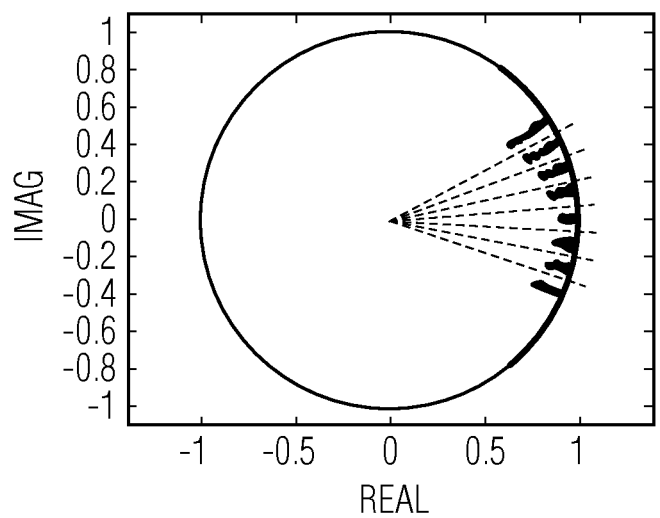
FIG. 8b shows the results under the influence of non-ideal conditions.

FIGS. 7a and 7b show the results when the actual channel is different from what the pre-equalizer predicted (actual channel bandwidth is 10% higher than given by p, mistuning is 0 in p but 3% of the symbol frequency in the actual channel). FIGS. 8a and 8b assume a limited accuracy of the phase of the channel input signal x' (the phases were rounded to multiples of ¼ S.I. before applying them to the channel). The results are still acceptable in that the peak error is well below the 0.5 S.I. limit.

FIG. 7a uses 2π-PSK and has RMS phase error: 0.076 S.I and Peak phase error: 0.38 S.I. FIG. 7b uses a 56° PSK segment and has RMS phase error: 0.089 S.I and Peak phase error: 0.29 S.I.

FIG. 8a uses 2π-PSK and has RMS phase error: 0.079 S.I. and Peak phase error: 0.18 S.I. FIG. 8b uses a 56° PSK segment and has RMS phase error: 0.050 S.I Peak phase error: 0.11 S.I.

Figure 9A:
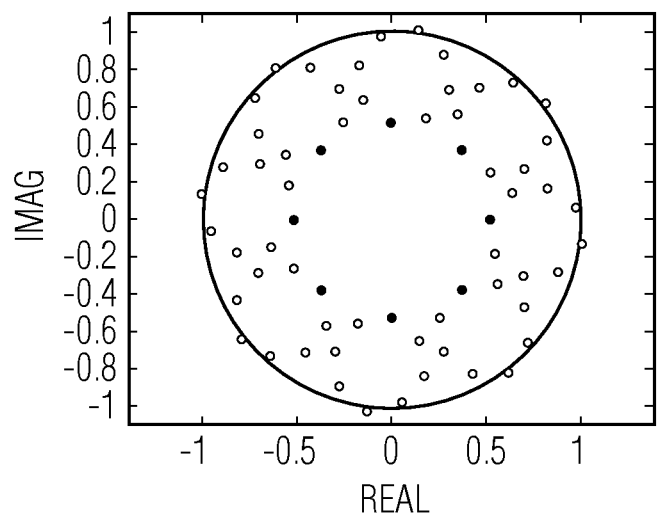
FIG. 9a shows the values of a conventional zero-forcing pre-equalizer output x' and corresponding channel output y when backing off the power amplifier.
Figure 9B:
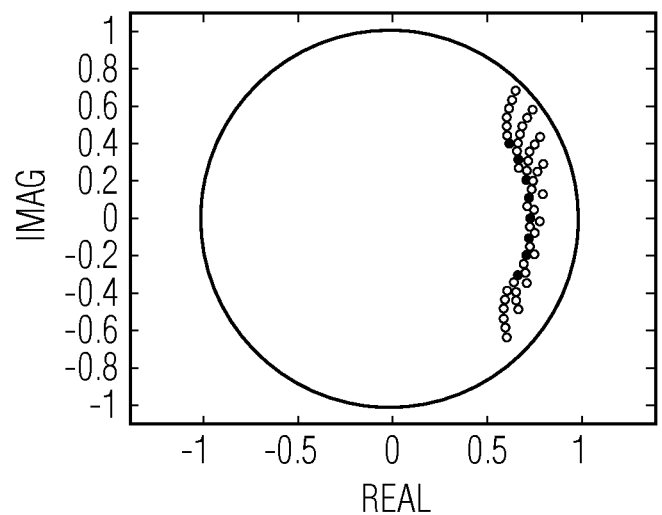
FIG. 9b shows the values of a conventional zero-forcing pre-equalizer output x' and corresponding channel output y when backing off the power amplifier.

FIGS. 9a and 9b show the values of a conventional zero-forcing pre-equalizer output x' (grey circles) and corresponding channel output y (black dots) when backing off the power amplifier such that the peak amplitude of x' equals 1. FIG. 9a uses 2π-PSK, FIG. 9b uses a 56° PSK segment.

A phase-only pre-equalizer does not suffer from lower transmitted power compared to the conventional zero-forcing equalizer even though the amplitude of the channel output y seems to be lower on average than when using the zero-forcing equalizer which would force the points y on the unit circle. When using the zero-forcing equalizer, one would have to back-off the power amplifier to allow the peak amplitudes that it needs to generate to fit within the output range, whereas when using the phase-only pre-equalizer, one can always operate the power amplifier at maximum power.

In the simulations, we scale the values of the pre-equalizer output x' such that the maximum amplitude of x' equals 1. Then we calculate the resulting variance of the channel output y, which is a measure for the power contained in that signal.

FIGS. 9a and 9b illustrate the performance of the conventional zero-forcing equalizer including said amplitude scaling (the versions for the phase-only pre-equalizer were already shown in FIGS. 5a and 5b). For the channel conditions used, the power in the channel output signal y when using the phase-only pre-equalizer is in fact 60% higher in the 56° PSK case and even more than 70% higher in the 2π-PSK case when compared to using zero-forcing equalization with power amplifier back-off.

FIG. 11a illustrates an embodiment of a pre-equalizer 200.

The figure shows a symbol source 200 from which an input stream of symbols is received. For example, a stream of digital information is encoded in the input stream of symbols. Only phases are used for the encoding, i.e., the input stream has constant magnitudes. We will assume that each input symbol comprises an in-phase and a quadrature component, but polar representation is also possible. The input stream may be digital, e.g., pairs of two digital numbers, e.g., I/Q pairs, but they may also be represented as pairs of analog signals.

The input stream is received as an input interface, e.g., a receiver for receiving the input stream. The pre-equalizer 200 comprises a delay element 220 for delaying the input stream by one symbol. A received input symbol (i.e., the next symbol) is multiplied in first real multiplier 232. The delayed input symbol (i.e. the previous symbol) is multiplied in second real multiplier 234. The real numbers used for the multiplications are obtained from an adjustment stream source 230. Adjustment stream source 230 produces adjusting real numbers. Pre-equalizer 200 comprises a symbol combiner 240, which combines the multiplied numbers. For example, the delayed number may be multiplied with '−p' and added to the other multiplied number. Herein 'p' denotes a model, e.g., an approximation, of the channel pole. The combiner 250 may be a conventional zero-forcing combiner. Obtaining a value for 'p' is known in the art.

The result of the symbol combiner 240 may be forwarded to an up-converter 207 via output interface 250. The upconverted signal is amplified using a switching power amplifier 208, and finally transmitted via antenna 209. The pre-equalizer may be combined with a suitable symbol source, upconverter, amplifier and antenna and used in a digital transmission system. A digital to analog converter may be used between the pre-equalizer 200 and the upconverter.

A corresponding receiver will receive less inter-symbol interference because of the pre-equalization when it receives the transmitted signal. The corresponding receiver will not receive a constant magnitude but that is not a problem since a PSK system is used.

FIG. 11b shows how adjusting stream source 230 may be arranged in pre-equalizer 200. Adjustment stream source 230 receives the next input stream symbol from the input interface 210 and the previous symbol from delay element 220, it computes, e.g., using a computer program adjusting numbers for use in multipliers 232 and 234.

FIG. 11c shows a further variation. This system comprises a further delay element 221 for delaying the stream by one number. Adjusting stream source 230 receives the next input symbol, the previous input symbol and the previous adjusting number. This allows a recursive definition of the adjusting number stream.

FIG. 11d shows yet a further variation, which avoids the need for a second multiplier. Multiplier 232 receives a next symbol from input interface 210 and is multiplied by a next adjusting number obtained from source 230. The multiplied number is input to combiner 240. Delay element 220 delays the multiplied stream instead of the input stream. Combiner 240 receives the previous multiplied symbol from delay element 220. Source 230 may be connected to input interface through an additional one-symbol delay element 222.

Typically, the pre-equalizer 200 comprises a microprocessor (not shown) which executes appropriate software stored at the device, e.g., a corresponding memory, e.g. RAM or ROM (not shown). The adjusting number source 230 may also be equipped with its own microprocessors and memory (not shown), e.g., for a program and/or for storage. Pre-equalizer may also be implemented on a DSP.

FIG. 12 summarizes particular advantageous formulas. Formula 310 gives a recursive definition of the next equalized symbol. The formula 310 is implemented in the symbol combiner 240. The implementation may be in software, or in hardware (say in cmos), or in a combination. Formula 320 a formula which may be used by adjusting number source 230. Formula 330 a formula which may alternatively be used by adjusting number source 230; it is an approximation of formula 320. Note that many other approximations are possible.

Figure 13:
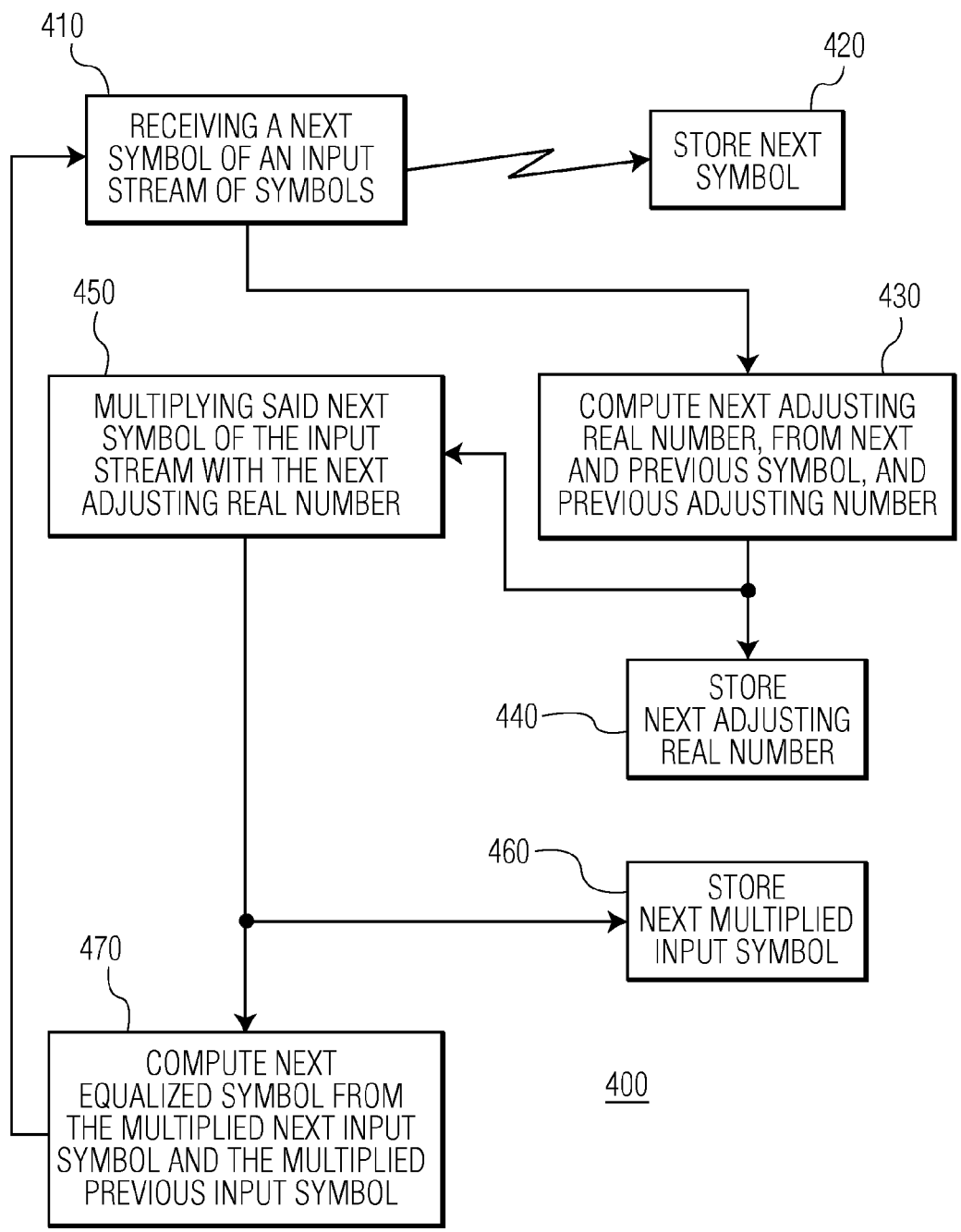
FIG. 13 illustrates in a flow chart an embodiment of a method for pre-equalizing.

FIG. 13 illustrates in a flow chart an embodiment 400 of a method for pre-equalizing a digital modulated RF signal. In step 410 a next symbol is received of an input stream of symbols (x(i)) representing a phase change and magnitude of an RF signal, the magnitudes of the symbols in the input stream are constant, the phase changes of the symbols in the input stream encode digital information. The input stream is adjusting to reduce inter-symbol interference in transmission by the method.

In step 420 the received next input symbol is stored in a memory for use in the next iteration, as the previous symbol. In step 430 a next adjusting real number is computed, from the next and previous symbol, and the previous adjusting number. In the step 440 the next adjusting real number is stored for use in the next iteration, as the previous adjusting number. Step 430 may use formula 320 or formula 330 or another approximation of formula 320. In step 450 the next input symbol is multiplied with the next adjusting real number, thus the next multiplied input symbol is obtained. In step 460 the next multiplied input symbol is stored for use in the next iteration as the previous multiplied input symbol. In step 470 the next equalized symbol is computed from the multiplied next input symbol and the previous multiplied input symbol. Step 470 may use formula 310. After the next equalized symbol is computed in step 470 the method return to step 420 to receive a next input symbol. Steps 420, 440 and 460 may use a memory for storage, e.g., a RAM memory. The memory may be internal to pre-equalizer 200.

Many different ways of executing the method are possible, as will be apparent to a person skilled in the art. For example, the order of the steps can be varied or some steps may be executed in parallel. Moreover, in between steps other method steps may be inserted. The inserted steps may represent refinements of the method such as described herein, or may be unrelated to the method. For example, some steps may be executed, at least partially, in parallel. Moreover, a given step may not have finished completely before a next step is started.

A method according to the invention may be executed using software, which comprises instructions for causing a processor system to perform method 400. Software may only include those steps taken by a particular sub-entity of the system. The software may be stored in a suitable storage medium, such as a hard disk, a floppy, a memory etc. The software may be sent as a signal along a wire, or wireless, or using a data network, e.g., the Internet. The software may be made available for download and/or for remote usage on a server.

It will be appreciated that the invention also extends to computer programs, particularly computer programs on or in a carrier, adapted for putting the invention into practice. The program may be in the form of source code, object code, a code intermediate source and object code such as partially compiled form, or in any other form suitable for use in the implementation of the method according to the invention. An embodiment relating to a computer program product comprises computer executable instructions corresponding to each of the processing steps of at least one of the methods set forth. These instructions may be subdivided into subroutines and/or be stored in one or more files that may be linked statically or dynamically. Another embodiment relating to a computer program product comprises computer executable instructions corresponding to each of the means of at least one of the systems and/or products set forth.

It should be noted that the above-mentioned embodiments illustrate rather than limit the invention, and that those skilled in the art will be able to design many alternative embodiments.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

Appendix A and B are included for illustrative purposes.

Appendix A: Derivation of Phase-Only Pre-Equalizer Transfer

One application of the phase-only pre-equalizer was captured in two equations which are repeated here for convenience:

$$y(n) = p \cdot y(n-1) + (1-p) \cdot x'(n) = \alpha(n) \cdot x(n) \qquad 1)$$

$$|x'(n)| \equiv 1 \qquad 2)$$

with x(n) the time-discrete phasor (complex amplitude) describing the pure PSK wanted channel output, x'(n) the phasor of the signal driving the channel and y(n) is the phasor describing the actual channel output. The channel transfer is described by pole p. The symbol $\alpha(n)$ is a positive real number representing the fact that the phase of y(n) equals that of x(n) if the phase-only pre-equalizer does a good job.

The equation can solved for x'(n):

$$x'(n) = \frac{\alpha(n) \cdot x(n) - p \cdot y(n-1)}{1-p} \qquad 3)$$

where $\alpha(n)$ is unknown at this point in the derivation. In fact, solving for $\alpha(n)$ is the main point of this appendix.

Using the second equality in equation (1) we can substitute $y(n-1) = \alpha(n) \cdot x(n-1)$ $$x'(n) = \frac{\alpha(n) \cdot x(n) - p \cdot \alpha(n-1) \cdot x(n-1)}{1-p} \qquad 4)$$

First, we add the boundary condition on the magnitude of x' (equation (2)) to solve for $\alpha(n)$:

$$|x'(n)| = \left| \frac{\alpha(n) \cdot x(n) - p \cdot \alpha(n-1) \cdot x(n-1)}{1-p} \right| \equiv 1 \qquad 5)$$

from which directly follows:

$$|\alpha(n) \cdot x(n) - p \cdot \alpha(n-1) \cdot x(n-1)|^2 = |1-p|^2 \qquad 6)$$

The left-hand side can be written as:

$|\alpha(n) \cdot x(n) - p \cdot \alpha(n-1) \cdot x(n-1)|^2 = (\alpha(n) \cdot x(n) - p \cdot \alpha(n-1) \cdot x(n-1)) \cdot \overline{(\alpha(n) \cdot x(n) - p \cdot \alpha(n-1) \cdot x(n-1))} = (\alpha(n) \cdot x(n) - p \cdot \alpha(n-1) \cdot x(n-1)) \cdot (\alpha(n) \cdot \overline{x}(n) - \alpha(n-1) \cdot \overline{p} \cdot \overline{x}(n-1)) = \alpha^2(n) \cdot |x(n)|^2 - \alpha(n) \cdot \alpha(n-1) \cdot 2 \, Re(p \cdot \overline{x}(n)x(n-1)) + \alpha^2(n-1)|x(n-1)|$ \qquad 7)

where the top-bars indicate complex conjugation.

The magnitude of the original (wanted) constellation points x(n) equals 1, since we are using a pure PSK. This (slightly) reduces equation (7) to:

$$|\alpha(n) \cdot x(n) - p \cdot \alpha(n-1) \cdot x(n-1)|^2 = \alpha^2(n) - \alpha(n) \cdot \alpha(n-1) \cdot 2 \operatorname{Re}(p \cdot \overline{x}(n) x(n-1)) + \alpha^2(n-1)|p|^2 \quad 8)$$

Combining equations (6) and (8) results in a quadratic equation in $\alpha(n)$:

$$\alpha^2(n) - \alpha(n) \cdot \alpha(n-1) \cdot 2 \operatorname{Re}(p \cdot \overline{x}(n) x(n-1)) + \alpha^2(n-1)|p|^2 - |1-p|^2 = 1 \quad 9)$$

The general solution to this quadratic equation is:

$$\alpha(n) = \frac{-b \pm \sqrt{b^2 - 4c}}{2} \quad 10)$$

with $$b = -2\alpha(n-1)\operatorname{Re}(p \cdot \overline{x}(n) x(n-1))$$

$$c = \alpha^2(n-1)|p|^2 - |1-p|^2 \quad 11)$$

Substituting equation (11) in equation (10) results in:

$$\alpha(n) = \alpha(n-1)\operatorname{Re}(p \cdot \overline{x}(n) x(n-1)) + \sqrt{\alpha^2(n-1)\operatorname{Re}^2(p \cdot \overline{x}(n) x(n-1)) + |1-p|^2 - \alpha^2} \quad 12)$$

Note that the — solution of equation (10) does not suffice since it results in a negative value for $\alpha(n)$.

Finally, the value of $\alpha(n)$ can be used in equation (3) to get the desired value of x'(n) as a function of (known) input values x and the previous value of $\alpha$.

Appendix B: Approximating the Phase-Only Pre-Equalizer Solution

A first-order Taylor expansion of the quadratic equation of equation (9) is performed, such that a linear equation remains that can be solved without resulting in a square-root operator. The Taylor expansion of the left-hand side of equation (9) around $\alpha(n) = \alpha_0$ ($\alpha_0$ being some real-valued constant that would be close the solution of the quadratic equation) is given by:

$$\alpha^2(n) + b\alpha(n) + c \approx \alpha_0^2 + b\alpha_0 + c + (2\alpha_0 + b) \cdot (\alpha(n) - \alpha_0) = -\alpha_0^2 + c + (2\alpha_0 \quad 13)$$

The root of this (now linear) equation is:

$$\alpha(n) \approx \frac{\alpha_0^2 - c}{2\alpha_0 + b} \quad 14)$$

which does not involve square-root evaluation.

For example, assuming that the solution for $\alpha(n)$ is always close to 1 (meaning $y(n) \approx x(n)$, which turns out to be not too far off for channels with moderate bandwidth limitations), the solution of quadratic equation (9) can be reasonably well approximated using equation (14) with $\alpha_0 = 1$:

$$\alpha(n) \approx \frac{1-c}{2+b} = \frac{1}{2} \cdot \frac{1 - \alpha^2(n-1)|p|^2 - |1-p|^2}{1 - \alpha^2(n-1)\operatorname{Re}(p \cdot \overline{x}(n) x(n-1))} \quad 15)$$

One can approximate even further if one also wants to remove of the division with variable denominator in equation (14) as follows:

$$\alpha(n) \approx \frac{\alpha_0^2 - c}{2\alpha_0 + b} = \frac{(\alpha_0^2 - c)(2\alpha_0 - b)}{4\alpha_0^2 - b^2} \approx \frac{1}{4\alpha_0^2} \cdot (\alpha_0^2 - c)(2\alpha_0 - b) \quad 16)$$

where the latter approximation holds when $b^2 \ll 4\alpha_0^2$.

So, again for example, for $\alpha_0 = 1$ this would reduce to:

$$\alpha(n) \approx \frac{1}{4} \cdot (1-c)(2-b) \quad 17)$$

$$= \frac{1}{2} \cdot \left( \frac{1 - \alpha^2(n-1)|p|^2 -}{|1-p|^2} \right) (1 + \alpha^2(n-1)\operatorname{Re}(p \cdot \overline{x}(n))$$

Finally, one could pursue this approach further to get better approximations. Continuing from equation (16):

$$\alpha(n) \approx \frac{\alpha_0^2 - c}{2\alpha_0 + b} \quad 18)$$

$$= \frac{(\alpha_0^2 - c)(2\alpha_0 + b)(4\alpha_0^2 + b^2)}{16\alpha_0^4 - b^4}$$

$$\approx \frac{1}{16\alpha_0^4} \cdot (\alpha_0^2 - c)(2\alpha_0 + b) |$$

which, for $\alpha_0 = 1$ reduces to:

$$\alpha(n) \approx \frac{1}{16} \cdot (1-c)(2+b)(4+b^2) \quad 19)$$

The invention claimed is:

1. A method for pre-equalizing a digital modulated RF signal, the method comprising:
   receiving an input stream of symbols (x(i)) representing a phase change and magnitude of an RF signal, wherein the magnitudes of the symbols in the input stream are constant and the phase changes of the symbols in the input stream encode digital information, and
   adjusting the input stream of symbols to reduce inter-symbol interference in transmission of an RF signal modulated according to the input stream, thus obtaining an equalized stream of symbols (x'(i)), each symbol of the equalized stream representing a phase change and magnitude of an RF signal,
   the adjusting comprising iteratively determining a next symbol of the equalized stream (x'(n)) after receiving a next symbol of the input stream (x(n)) by
   multiplying said next symbol of the input stream (x(n)) with a next adjusting real number (a(n)),
   multiplying a previous symbol of the input stream (x(n−1)) with a previous adjusting real number (a(n−1)), said previous symbol being received directly before said next symbol of the input stream, and
   computing the next symbol of the equalized stream from the multiplied next symbol of the input stream and the multiplied previous symbol of the input stream,
   wherein the equalized stream is defined by the following formula:

$$x'(n) = \frac{\alpha(n) \cdot x(n) - p \cdot \alpha(n-1) \cdot x(n-1)}{1-p},$$

with the value of a(n) defined recursively as:

$$\alpha(n) = \alpha(n-1)\text{Re}(p \cdot \bar{x}(n)x(n-1)) + \sqrt{\alpha^2(n-1)\text{Re}^2(p \cdot \bar{x}(n)x(n-1)) + |1-p|^2 - \alpha^2(n-1)|p|^2}$$

wherein x'(n) represents the equalized stream, α(n) represents an adjusting stream, and p represents a model of the RF channel.

2. A method as in claim 1, comprising
iteratively generating the adjusting stream of adjusting real numbers, comprising
after receiving the next symbol of the input stream determining the next adjusting real number of the adjusting stream, the next adjusting real number of the adjusting stream depending on said next symbol of the input stream, said previous symbol of the input stream and the previous adjusting real number in the adjusting stream of adjusting real numbers.

3. A method as in claim 1, comprising
computing the next symbol of the equalized stream comprises multiplying said multiplied previous symbol with a modeling complex number (−p) indicating the RF channel through which a RF signal modulated according to the equalized stream is to be sent, and adding to the result to said multiplied next symbol.

4. Method for transmitting a digital modulated signal comprising the method of pre-equalizing a digital modulated signal as in claim 1 and further comprising,
upconverting the equalized stream of symbols into an RF signal.

5. Method for transmitting as in claim 4, comprising amplifying the RF signal using a switching power amplifier.

6. A pre-equalizer for use in a digital modulation RF transmitter, comprising
an input interface for receiving an input stream of symbols (x(i)) representing a phase change and magnitude of an RF signal, wherein the magnitudes of the symbols in the input stream are constant and the phase changes of the symbols in the input stream encode digital information, and
an output interface for outputting an equalized stream of symbols (x'(i)) obtained by adjusting the input stream of symbols to reduce inter-symbol interference in transmission of an RF signal modulated according to the input stream, each symbol of the equalized stream representing a phase change and magnitude of an RF signal, the pre-equalizer is configured to iteratively determine a next symbol of the equalized stream (x'(n)) after receiving a next symbol of the input stream (x(n)), the pre-equalizer comprises a
a first multiplier configured to multiply said next symbol of the input stream (x(n)) with a next adjusting real number (a(n)),
a second multiplier configured to multiply a previous symbol of the input stream (x(n−1)) with a previous adjusting real number (a(n−1)), said previous symbol being received directly before said next symbol of the input stream, and
a symbol combiner configured to compute the next symbol of the equalized stream from the multiplied next symbol of the input stream and the multiplied previous symbol of the input stream,
wherein the equalized stream is defined by the following formula:

$$x'(n) = \frac{\alpha(n) \cdot x(n) - p \cdot \alpha(n-1) \cdot x(n-1)}{1-p},$$

with the value of α(n) defined recursively as:

$$\alpha(n) = \alpha(n-1)\text{Re}(p \cdot \bar{x}(n)x(n-1)) + \sqrt{\alpha^2(n-1)\text{Re}^2(p \cdot \bar{x}(n)x(n-1)) + |1-p|^2 - \alpha^2(n-1)|p|^2}$$

wherein x'(n) represents the equalized stream (120), α(n) represents an adjusting stream, and p represents a model of the RF channel.

7. A pre-equalizer for use in a digital modulation RF transmitter as in claim 6, comprising an adjustment stream source configured to iteratively generate an adjusting stream of adjusting real numbers, by after receiving the next symbol of the input stream determining the next adjusting real number of the adjusting stream, the next adjusting real number of the adjusting stream depending on said next symbol of the input stream, said previous symbol of the input stream and the previous adjusting real number in the adjusting stream of adjusting real numbers.

8. A digital modulation RF transmitter comprising a pre-equalizer as in claim 6, an upconverter configured to upconvert the equalized stream of symbols into an RF signal, and a switching power amplifier configured to amplifying the RF signal of the upconverter.

9. A computer program embodied on a non-transitory computer readable medium comprising computer program code adapted to perform all the steps of claim 1 when the computer program is run on a computer.

\* \* \* \* \*